United States Patent
Ellsworth, Jr. et al.

(10) Patent No.: US 9,423,058 B2
(45) Date of Patent: Aug. 23, 2016

(54) FORMED HOSE WITH DIFFERENT FIBER-REINFORCED REGIONS

(71) Applicant: INTERNATIONAL BUSINESS MACHINES CORPORATION, Armonk, NY (US)

(72) Inventors: Michael J. Ellsworth, Jr., Poughkeepsie, NY (US); Prabjit Singh, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 114 days.

(21) Appl. No.: 14/246,208

(22) Filed: Apr. 7, 2014

(65) Prior Publication Data

US 2015/0289412 A1   Oct. 8, 2015

(51) Int. Cl.
| | |
|---|---|
| *F16L 11/04* | (2006.01) |
| *F16L 11/10* | (2006.01) |
| *F16L 11/12* | (2006.01) |
| *H05K 7/20* | (2006.01) |
| *F16L 11/08* | (2006.01) |
| *F16L 33/30* | (2006.01) |

(Continued)

(52) U.S. Cl.
CPC .............. *F16L 11/04* (2013.01); *F16L 11/085* (2013.01); *F16L 11/10* (2013.01); *F16L 11/12* (2013.01); *F16L 33/30* (2013.01); *F16L 35/00* (2013.01); *H05K 7/20272* (2013.01); *H05K 7/20781* (2013.01); *F16L 11/122* (2013.01); *F16L 33/2071* (2013.01); *Y10T 29/49002* (2015.01); *Y10T 29/4994* (2015.01)

(58) Field of Classification Search
None
See application file for complete search history.

(56) References Cited

U.S. PATENT DOCUMENTS

| | | | | |
|---|---|---|---|---|
| 2,805,088 A | * | 9/1957 | Swick, Jr. ............... | A47L 9/242 285/239 |
| 3,028,291 A | | 4/1962 | Roberts et al. | |

(Continued)

FOREIGN PATENT DOCUMENTS

JP          11-010745 A       1/1999

OTHER PUBLICATIONS

"The 2009 Hose Handbook", Eighth Edition, Rubber Manufacturers Association, Inc., Washington, D.C. (2009) (120 pages).

(Continued)

*Primary Examiner* — Courtney Smith
(74) *Attorney, Agent, or Firm* — Margaret A. McNamara, Esq.; Kevin P. Radigan, Esq.; Heslin Rothenberg Farley & Mesiti P.C.

(57) ABSTRACT

Formed hose configurations are provided which include an innermost elastomer layer, a first fiber-reinforcement region, and multiple second fiber-reinforcement regions. The first fiber-reinforcement region has a first fiber-reinforcement density, and is disposed, at least in part, at a bend region of the formed hose, and the multiple second fiber-reinforcement regions have a second fiber-reinforcement density, and are disposed at least at the first and second end regions of the formed hose. The second fiber-reinforcement density is greater than the first fiber-reinforcement density, and results in the first and second ends of the formed hose being less radially-deformable than the bend region of the hose. This facilitates providing a mechanical fluid-tight connection with a hose barb fitting when the formed hose is slid over the hose barb fitting, absent any clamp over the formed hose and hose barb fitting connection.

7 Claims, 12 Drawing Sheets

(51) Int. Cl.
*F16L 35/00* (2006.01)
*F16L 33/207* (2006.01)

(56) References Cited

U.S. PATENT DOCUMENTS

| | | | | |
|---|---|---|---|---|
| 3,210,100 | A | * 10/1965 | Thebeault | F16L 33/30 |
| | | | | 285/239 |
| 3,610,289 | A | 10/1971 | Moss | |
| 4,192,351 | A | 3/1980 | Henry | |
| 4,431,031 | A | * 2/1984 | Ettlinger | F16L 11/086 |
| | | | | 138/109 |
| 4,518,018 | A | 5/1985 | Kutnyak et al. | |
| 4,830,059 | A | 5/1989 | Silberstang | |
| 5,070,597 | A | * 12/1991 | Holt | F16L 5/02 |
| | | | | 138/103 |
| 5,941,286 | A | 8/1999 | Fauble et al. | |
| 2004/0154732 | A1 | 8/2004 | Mason et al. | |
| 2005/0165366 | A1 | 7/2005 | Brustad et al. | |
| 2005/0199308 | A1 | * 9/2005 | Swails | F16L 11/088 |
| | | | | 138/109 |
| 2007/0207186 | A1 | * 9/2007 | Scanlon | A61F 2/07 |
| | | | | 424/424 |
| 2007/0227610 | A1 | 10/2007 | Sakazaki | |
| 2009/0126821 | A1 | 5/2009 | Domonkos et al. | |
| 2012/0168012 | A1 | 7/2012 | Statler, III et al. | |
| 2012/0216903 | A1 | * 8/2012 | Osborne | B65H 69/08 |
| | | | | 138/137 |
| 2015/0283658 | A1 | 10/2015 | Ellsworth, Jr. et al. | |

OTHER PUBLICATIONS

Ellsworth, Jr. et al., "An Overview of the IBM Power 775 Supercomputer Water Cooling System", Proceedings of IPACK2011-52130, Portland, OR (Jul. 6-8, 2011) (9 pages).

Ellsworth, Jr. et al., "List of IBM Patents and/or Patent Applications Treated as Related", U.S. Appl. No. 14/246,208, filed Apr. 7, 2014 (U.S. Pat. No. 2015/0289412 A1), dated Mar. 9, 2016 (2 pages).

Ellsworth, Jr. et al., "Formed Hose with Different Fiber-Reinforced Regions", U.S. Appl. No. 15/063,548, filed Mar. 8, 2016 (41 pages).

Ellsworth, Jr. et al., "List of IBM Patents and/or Patent Applications Treated as Related", U.S. Appl. No. 14/246,208, filed Apr. 7, 2014 (U.S. Pat. No. 2015/0289412 A1), dated Mar. 25, 2016 (2 pages).

* cited by examiner

FORMED HOSE WITH DIFFERENT FIBER-REINFORCED REGIONS

BACKGROUND

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic.

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in recirculation problems with some fraction of the "hot" air exiting one rack unit being drawn into the air inlet of the same rack or a nearby rack. This re-circulating flow is often extremely complex in nature, and can lead to significantly higher rack inlet temperatures than expected. In such installations, liquid cooling (e.g., water cooling) is an attractive technology to assist in managing the higher heat fluxes. The liquid absorbs the heat dissipated by the components/modules in an efficient manner, and the heat can be ultimately transferred from the liquid to an outside environment, whether air or other liquid coolant.

To introduce liquid cooling into one or more computer server units, it is necessary that tubings and fittings be provided which are acceptable within a typical electronics rack, such as a server cabinet.

BRIEF SUMMARY

The shortcomings of the prior art are overcome and additional advantages are provided through the provision, in one aspect, of an apparatus which includes a formed hose sized to engageably slide over a hose barb fitting and form a mechanical, fluid-tight connection therewith. The formed hose is a permanently-shaped, partially-deformable, reinforced hose, formed with at least one bend intermediate first and second end regions thereof, and includes: an innermost elastomer layer; a first fiber-reinforcement region of a first fiber-reinforcement density over the innermost elastomer layer at least at the at least one bend of the formed hose; multiple second fiber-reinforcement regions of a second fiber-reinforcement density over, at least in part, the innermost elastomer layer, with second fiber-reinforcement regions of the multiple second fiber-reinforcement regions being disposed at least at the first and second end regions of the formed hose, wherein the second fiber-reinforcement density is greater than the first fiber-reinforcement density; and wherein the first and second end regions of the formed hose are less radially-deformable than the at least one bend thereof due, at least in part, to the second fiber-reinforcement density of the second fiber-reinforcement regions at the first and second end regions of the formed hose being greater than the first fiber-reinforcement density at the first fiber-reinforcement region at the at least one bend thereof, the second fiber-reinforcement density facilitating providing the mechanical, fluid-tight connection when one of the first end region or the second end region of the formed hose is slid over the hose barb fitting, absent any clamp over the formed hose and hose barb fitting connection.

In another aspect, a cooled electronic system is provided which includes an electronic system having at least one liquid-cooled component, and a liquid cooling apparatus for facilitating liquid coolant flow through the at least one liquid-cooled component of the electronic system. The cooling apparatus includes: a coolant loop with a mechanical, fluid-tight connection comprising a hose barb fitting and a formed hose slid over the hose barb fitting at one end thereof, the formed hose facilitating carrying coolant towards or away from the at least one liquid-cooled component of the electronic system, and the formed hose being a permanently-shaped, partially-deformable, reinforced hose, formed with at least one bend intermediate a first end region and a second end region thereof. The formed hose includes: an innermost elastomer layer; a first fiber-reinforcement region of a first fiber-reinforcement density over the innermost elastomer layer at least at the at least one bend of the formed hose; and multiple second fiber-reinforcement regions of a second fiber-reinforcement density over, at least in part, the innermost elastomer layer, with second fiber-reinforcement regions of the multiple second fiber-reinforcement regions being disposed at least at the first and second end regions of the formed hose, wherein the second fiber-reinforcement density is greater than the first fiber-reinforcement density, and the first and second end regions of the formed hose are less radially-deformable than the at least one bend thereof due, at least in part, to the second fiber-reinforcement density of the second fiber-reinforcement regions at the first and second end regions of the formed hose being greater than the first fiber-reinforcement density at the first fiber-reinforcement region at the at least one bend thereof, the second fiber-reinforcement density facilitating providing the mechanical, fluid-tight connection, absent any clamp over the formed hose and hose barb fitting connection.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
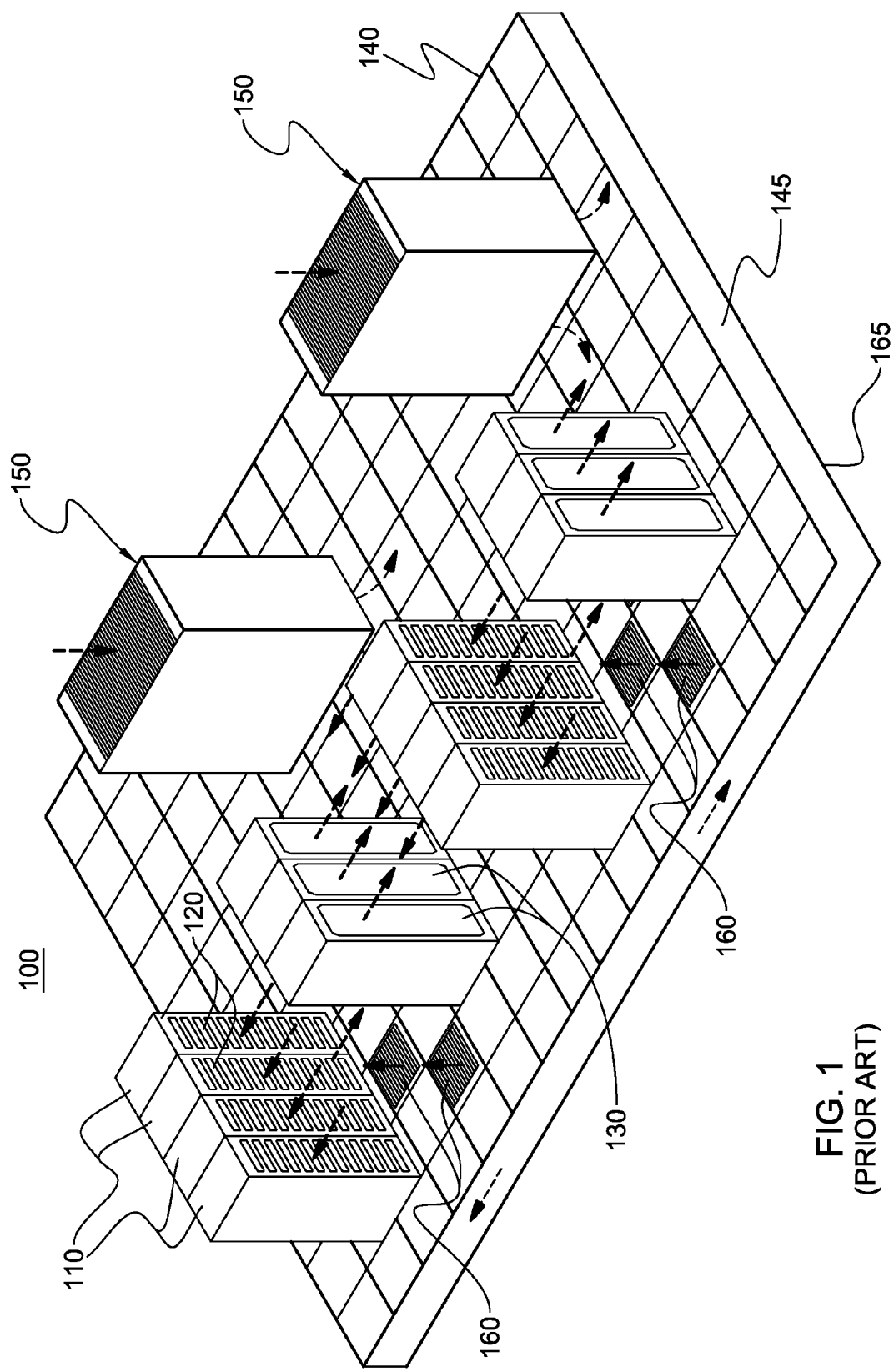
FIG. 1 depicts one embodiment of a conventional raised-floor layout of an air-cooled data center.

Generally stated, provided herein are certain novel formed hose configurations and methods of fabrication thereof for facilitating forming a mechanical, fluid-tight connection with a hose barb fitting for, for example, use within a liquid-cooling apparatus providing coolant to one or more electronic subsystems within an electronics rack. The mechanical, fluid-tight connection is formed between a specially-configured, formed hose and a hose barb fitting. The formed hose is a permanently-shaped, partially-deformable, reinforced hose, formed with one or more permanently-curved or bent portions intermediate first and second ends of the hose. The formed hose advantageously includes different fiber-reinforcement regions along its length, with greater fiber-reinforcement density being provided in selected reinforcement regions, including at the first and second end regions of the formed hose. This greater fiber-reinforcement density at the formed hose ends ensures a better mechanical, fluid-tight connection of the formed hose to a hose barb fitting when one end of the hose is slid over the fitting, absent any need for a clamp over the formed hose and hose barb fitting connection. In particular, the greater fiber-reinforcement density at the first and second end regions of the formed hose means that the formed hose is less radially-deformable at the end regions, and thus the formed hose grips the fittings at the end regions of the hose better, that is, in comparison with a formed hose without the enhanced fiber-reinforcement at its ends.

Prior to depicting various embodiments of formed hoses and methods of fabricating formed hoses, in accordance with aspects of the present invention, the environment of a cooled electronic system is described below with reference to FIGS. 2-5. In one or more implementations, the formed hoses described herein may be advantageously employed within a liquid-cooling apparatus of a cooled electronic system, such as a liquid-cooled electronics rack, wherein space for tubings and fittings may be constrained. Prior to describing these figures, however, certain terms used herein are initially defined.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise one or more electronic systems or subsystems, each having one or more heat generating components disposed therein requiring cooling. "Electronic system" or "electronic subsystem" refers to any sub-housing, blade, book, drawer, node, compartment, etc., having one or more heat generating electronic components disposed therein. An electronic system or subsystem of an electronics rack may be movable or fixed relative to the electronics rack, with the rack-mounted electronic drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As one example, a heat generating electronic component could comprise multiple primary heat generating bare dies and multiple secondary heat generating dies on a common carrier. Further, unless otherwise specified herein, the terms "liquid-cooled structure" or "liquid-cooled cold plate" refer to any conventional thermally conductive structure having, for instance, a plurality of channels or passageways formed therein for flowing of liquid coolant therethrough.

As used herein, "air-to-liquid heat exchanger" means any heat exchange mechanism characterized as described herein through which liquid coolant can circulate and which transfers heat between air and the circulating liquid; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant. In another example, the facility coolant may be a refrigerant, while the system coolant is water. All of these variations are possible, while still maintaining the advantages and unique features of the present invention.

Reference is made below to the drawings, which are not necessarily drawn to scale for reasons of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
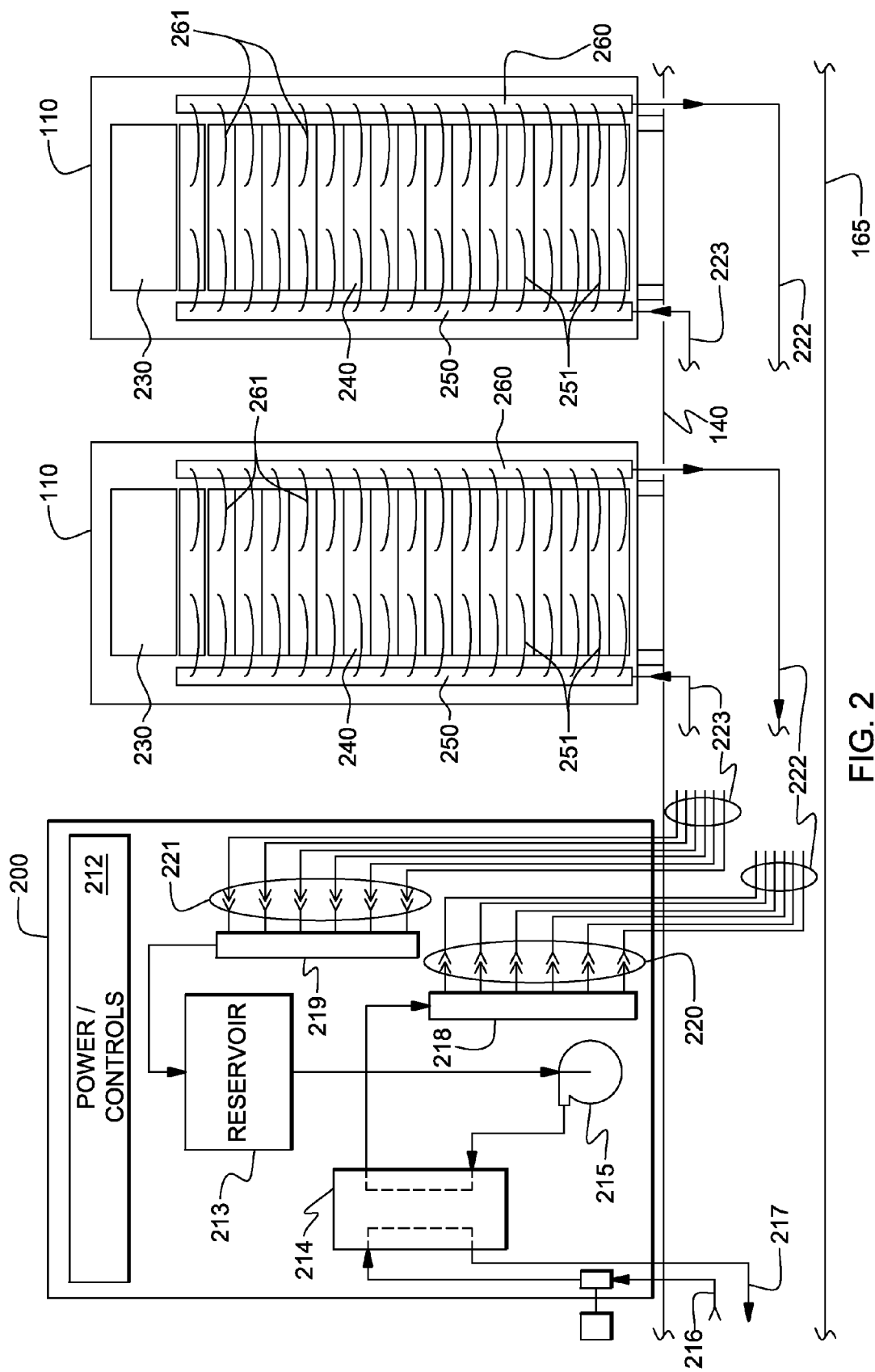
FIG. 2 depicts one embodiment of a coolant distribution unit for liquid-cooling of one or more electronics racks of a data center, in accordance with one or more aspects of the present invention.

FIG. 2 depicts one embodiment of a liquid-cooled data center comprising a coolant distribution unit 200. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 110 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center and lines 223 providing system coolant to system coolant supply manifolds 250 and lines 222 facilitating return of system coolant from system coolant return manifolds 260 are disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via hose connections 251, which are disposed between the supply manifold and the respective electronic subsystems within the rack. Similarly, system coolant return manifold 260 is coupled to the electronic subsystems via hose connections 261. Quick connect couplings may be employed at the interface between hoses 251, 261 and the individual electronics subsystems. By way of example, these quick connect couplings may comprise various types of commercially available couplings, such as those available from Colder Products Company, of St. Paul, Minn., USA, or Parker Hannifin, of Cleveland, Ohio, USA. In one embodiment, one or more of the hose connections 251, 261 illustrated in the example of FIG. 2 may be formed hoses, such as disclosed hereinbelow, in accordance with one or more aspects of the present invention.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

Figure 3:
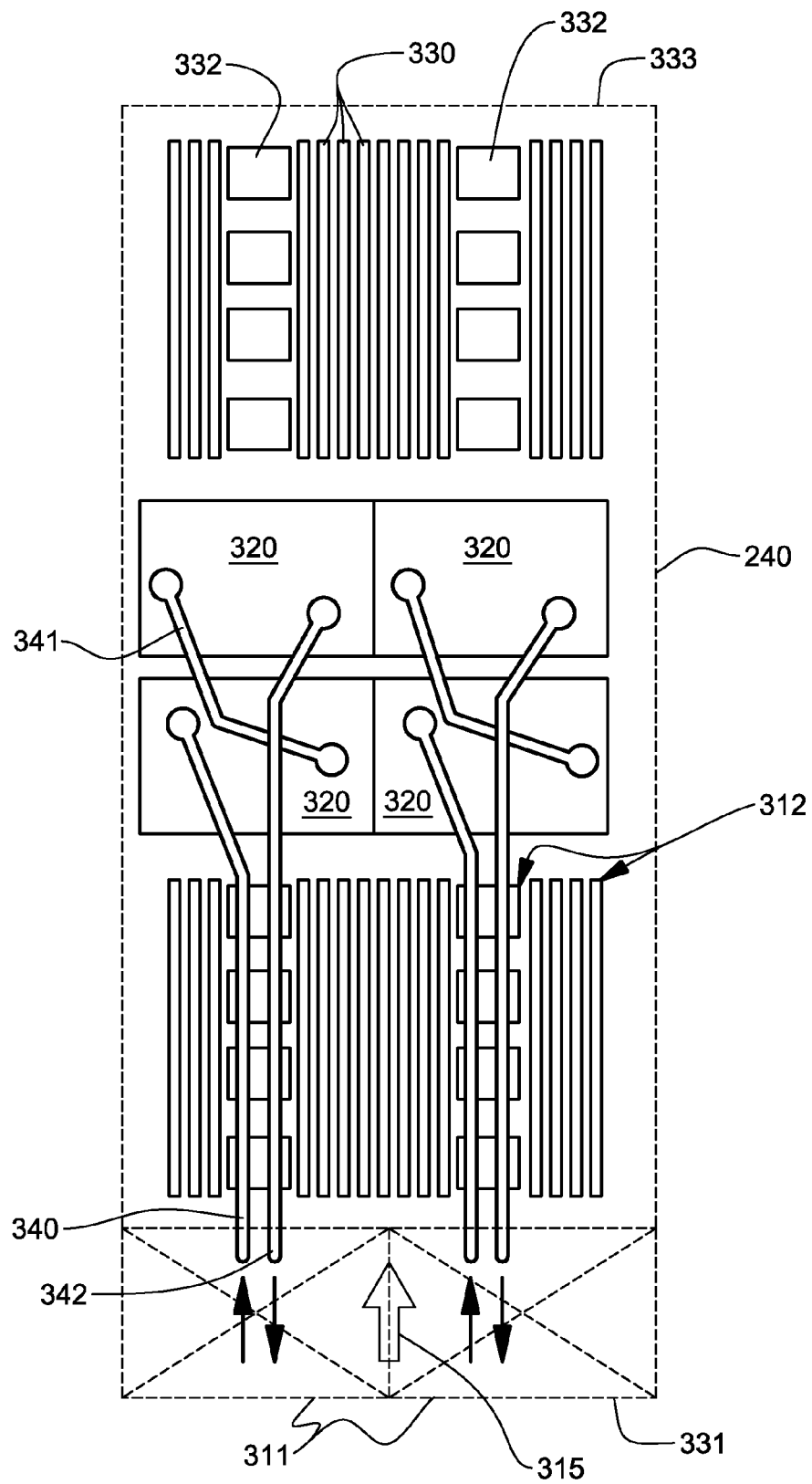
FIG. 3 is a plan view of one embodiment of an electronics subsystem layout illustrating an air and liquid-cooling subsystem for hybrid cooling of components of the electronic subsystem, in accordance with one or more aspects of the present invention.

FIG. 3 depicts one embodiment of an electronic subsystem 240 component layout wherein one or more air moving devices 311 provide forced air flow 315 to cool multiple components 312 within electronic subsystem 240. Cool air is taken in through a front 331 and exhausted out a back 333 of the drawer. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules)

to which air-cooled heat sinks are coupled. In the embodiment illustrated, memory modules 330 and the memory support modules 332 are partially arrayed near front 331 of electronics subsystem 240, and partially arrayed near back 333 of electronics subsystem 240. Also, in the embodiment of FIG. 3, memory modules 330 and the memory support modules 332 are cooled by air flow 315 across the electronics subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342. In one embodiment, one or more of the coolant-carrying tubes depicted in the liquid-based cooling system of FIG. 3 may be formed hoses, such as disclosed hereinbelow, in accordance with one or more aspects of the present invention.

Figure 4B:
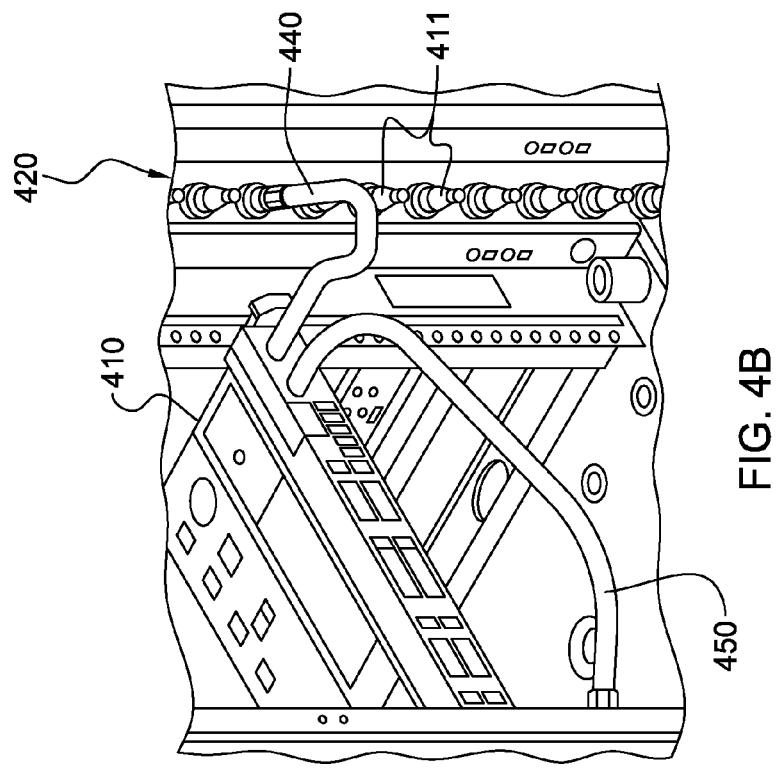
FIG. 4B is a partial depiction of a more detailed embodiment of the rack-level coolant distribution structures illustrated in FIG. 4A, in accordance with one or more aspects of the present invention.
Figure 4A:
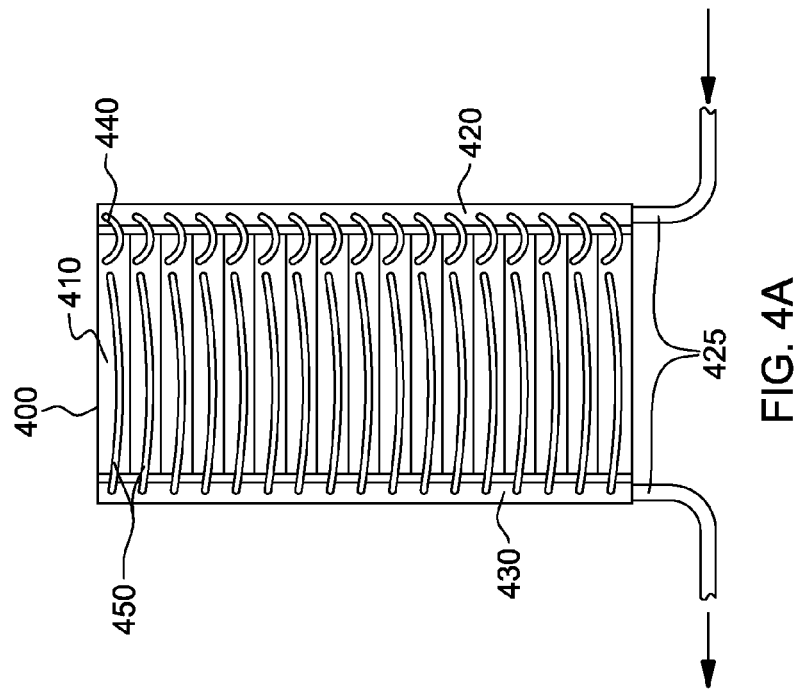
FIG. 4A is a more detailed, elevational view of one embodiment of the liquid-cooled electronics rack of FIG. 2, and illustrating rack-level coolant distribution structures, in accordance with one or more aspects of the present invention.

FIGS. 4A & 4B depict in greater detail one embodiment of a liquid-cooled electronics rack, such as depicted in FIGS. 2-3, in accordance with one or more aspects of the present invention. In this implementation, the liquid-cooled electronics rack 400 comprises a plurality of electronic systems 410, within which one or more electronic components are to be liquid-cooled via, for example, one or more cold plates or cold rails of a liquid-cooled structure, as described below. The cooling system includes coolant loop 425 coupled in fluid communication with rack-level coolant supply manifold 420 and rack-level coolant return manifold 430, both of which may comprise vertically-oriented manifolds attached to liquid-cooled electronics rack 400. In this embodiment, the rack-level coolant distribution system further includes individual node-level supply hoses 440 supplying coolant from coolant supply manifold 420 to the cold plates and cold rails within the electronic systems 410. As shown in FIG. 4B, coolant supply manifold 440 may be (in one embodiment) a vertically-oriented manifold with a plurality of coupling connections 411 disposed along the manifold, one for each electronic system 410 having one or more electronic components to be liquid-cooled. Coolant leaves the individual electronic systems 410 via node-level return hoses 450, which couple the individual liquid-cooled structures associated with the electronic systems (or nodes) to coolant return manifold 430, and hence, to coolant loop 425. Relatively warm-liquid coolant, such as water, may be supplied from the cooling unit, either directly, or through one or more air-to-liquid heat exchanger(s) (not shown), and hot coolant is returned via the coolant return manifold to the cooling unit. In one embodiment of the rack-level coolant distribution system illustrated in FIGS. 4A & 4B, the node-level supply and return hoses 440, 450 may be constructed or formed, such as disclosed hereinbelow, in accordance with one or more aspects of the present invention.

Figure 5:
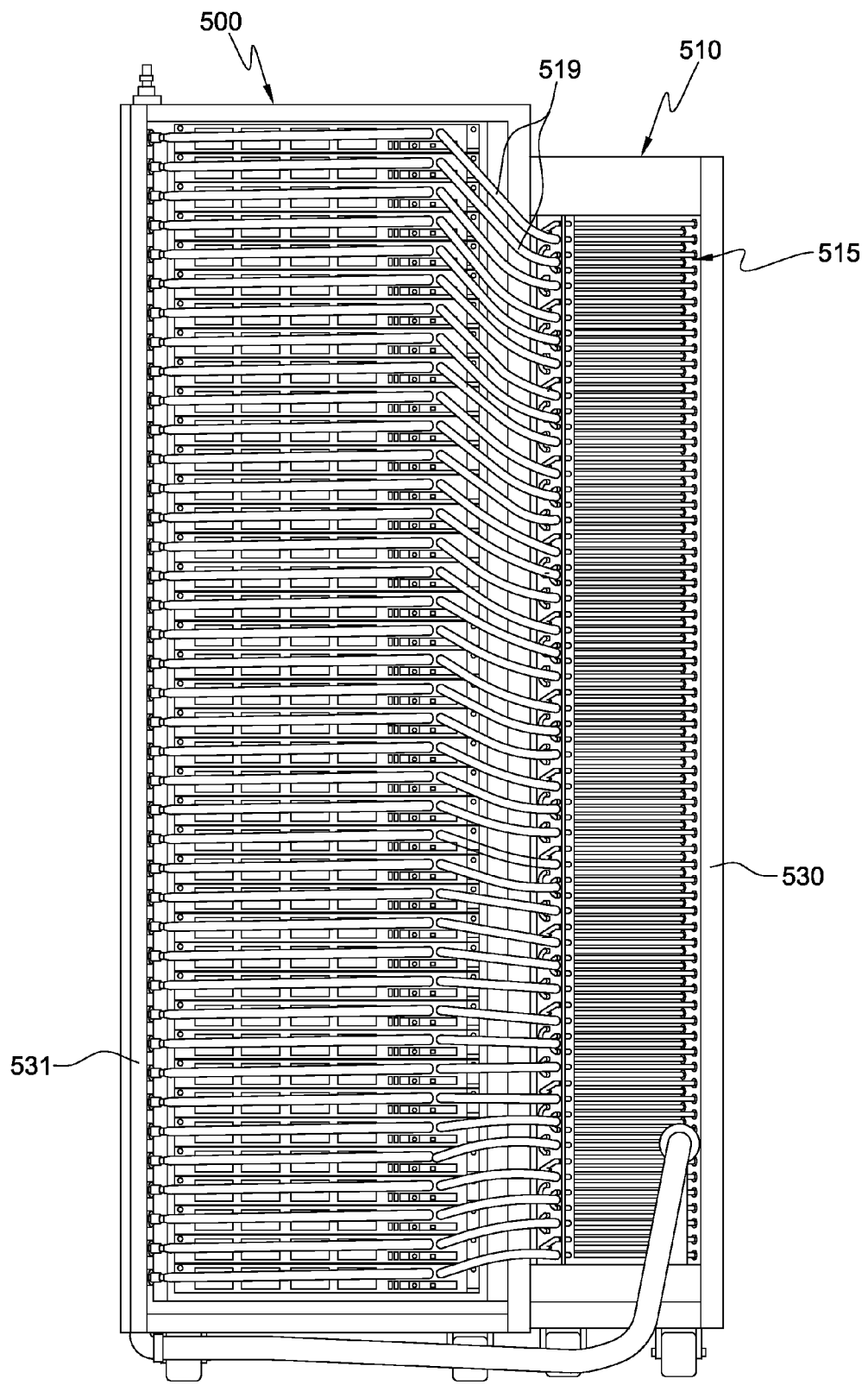
FIG. 5 is an elevational view of an alternate embodiment of a liquid-cooled electronic system, and illustrating rack-level coolant distribution structures, in accordance with one or more aspects of the present invention.

Another embodiment of a cooled electronic system comprising a liquid-cooled electronics rack and liquid-cooling apparatus therefor, in accordance with one or more aspects of the present invention, is depicted in FIG. 5. As shown, the electronics rack 500 has a sidecar structure 510 associated therewith (or attached thereto), which includes an air-to-liquid heat exchanger 515 through which air circulates from an air outlet side of electronics rack 500 towards an air inlet side of electronics rack 500, for example, in a closed loop path. Note that in an alternate embodiment, the air-to-liquid heat exchanger 515 could be disposed at one or more of the air inlet side or air outlet side of the electronics rack, for example, to facilitate cooling of airflow passing through the electronics rack.

In the example of FIG. 5, the cooled electronic system comprises a single coolant supply manifold 530 associated with air-to-liquid heat exchanger 515 and a single coolant return manifold 531 comprising a rack-level coolant return manifold associated with electronics rack 500. Also, in accordance with this embodiment of a cooled electronic system, the air-to-liquid heat exchanger 515 may divided into a plurality of distinct (e.g., separate), coolant-carrying tube sections, each of which may comprise a coolant inlet and a coolant outlet.

By way of example, in one embodiment, the coolant inlet of each distinct, coolant-carrying tube section is coupled in fluid communication with coolant supply manifold 530 to receive coolant therethrough. The coolant outlets of each coolant-carrying tube section are coupled via a respective tubing 519 in fluid communication with a liquid-cooled structure disposed within or associated with a respective electronic system (or subsystem) of the liquid-cooled electronics rack. By way of example, each liquid-cooled structure may comprise one or more liquid-cooled cold plates, and have any desired component layout. By way of example, reference the layout described above in connection with FIG. 3. Coolant exhausted from the individual electronic systems (or nodes) is returned via rack-level coolant return manifold 531. Advantageously, in this implementation, only two coolant manifolds are employed, one associated with the air-to-liquid heat exchanger 515, and the other associated with the electronics rack 500, which advantageously save costs in implementation. The plurality of tubes 519 may comprise a plurality of formed hoses, hose barb fittings, and quick connects may be employed throughout the cooled electronic system to facilitate coupling of the various liquid-cooling components of the liquid-cooling apparatus. In one embodiment of the coolant tubings illustrated in FIG. 5, one or more of the tubings of the liquid-cooling apparatus may comprise formed or pre-formed hoses, such as disclosed hereinbelow, in accordance with one or more aspects of the present invention.

Figure 6:
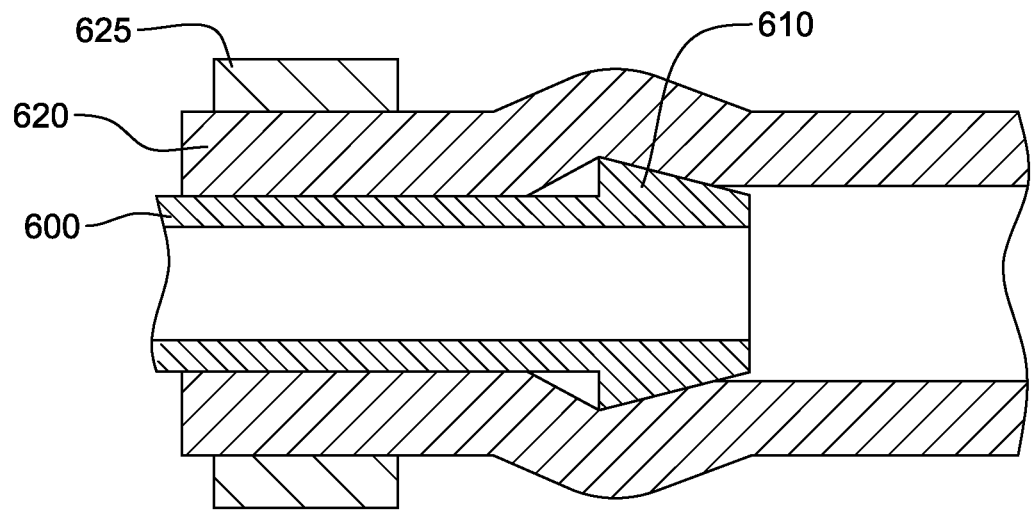
FIG. 6 is a cross-sectional elevational view of a conventional hose-barb connection between a fitting and hose.
Figure 7:
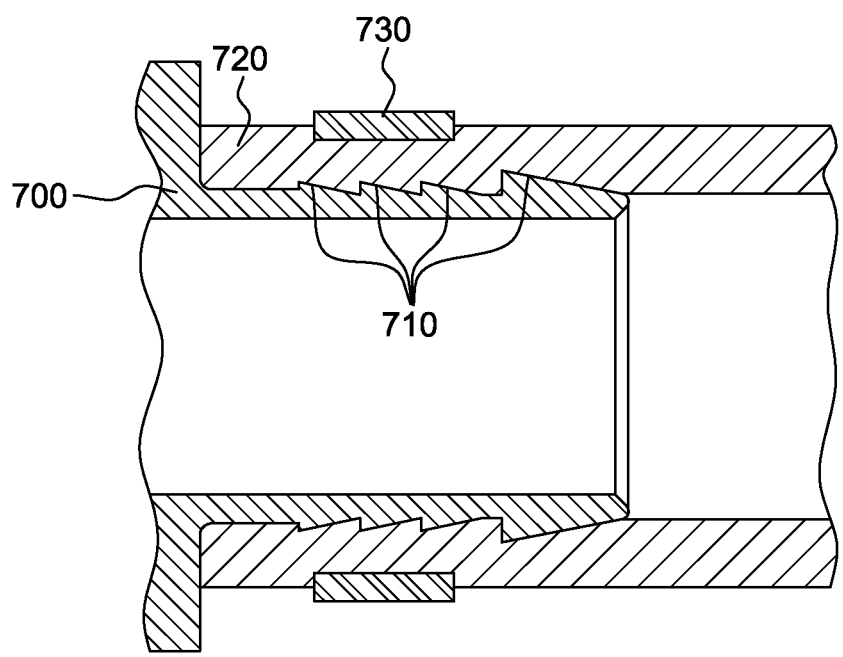
FIG. 7 is a cross-sectional elevational view of an apparatus which forms a mechanical, fluid-tight connection useful in a liquid-cooling apparatus such as depicted in FIGS. 2-5, in accordance with one or more aspects of the present invention.

As noted, one or more, or even all, of the hoses or tubes of the liquid-cooling apparatuses of FIGS. 2-5 may be or comprise flexible hoses, such as rubber hoses. FIGS. 6 & 7 depict two examples of a deformable hose end slid over and clamped to a hose barb fitting to form a mechanical, fluid-tight connection therewith. By way of example, the hose barb fitting could facilitate coupling of a quick connect coupling to the hose end, which may then be employed to couple the hose within the liquid-cooled system, as described above, or the hose barb fitting itself could couple or be the connection of the hose into the system. In the example of FIG. 6, a conventional external barb fitting is employed, while in the example of FIG. 7, an enhanced barb fitting is depicted.

Referring first to FIG. 6, a fitting 600, such as a metal fitting, is sized to reside within a flexible hose 620, which radially deforms about an exterior barb 610 in fitting 600 with placement of the fitting into the hose. Note that the barb's diameter is larger than the hose 620 inner diameter requiring the hose to deform concentrically outward. This works well for very compliant rubber and similar material hoses. A compression clamp 625 is also typically provided and involves other hardware in the form of a tab to be deformed to create the clamping force or an actuation mechanism (e.g., a worm gear and slots in the clamp body), further increasing the required volume for the assembly.

FIG. 7 depicts an alternative approach to forming a mechanical, fluid-tight connection using a deformable hose. In this figure, a fitting 700 (fabricated, for example, of metal) is provided having an outer diameter sized to slip or friction fit within the inner diameter of a hose 720. As illustrated, fitting 700 comprises multiple exterior barbs 710 disposed about an outer surface of the fitting within the region of overlap between the fitting and hose. Barbs 710 serve to grip and seal hose 720 to fitting 700 when the hose is deformed around the barbs, for example, via a shape memory alloy ring (or clamp) 730.

The apparatus of FIG. 7 is easily assembled by placing the deformable hose over the barbed fitting, and (in one embodiment) positioning shape memory alloy (SMA) ring 730 over the hose 720, aligned at least partially over barbs 710 in the fitting 700. Heat-shrinking of SMA ring 730 provides the necessary permanent clamping force to deform hose 720 into good contact with barbs 710 to maintain the tube on the barbs, thereby creating the mechanical, fluid-tight seal.

In one embodiment, the fitting 700 may be fabricated of a metal, such as stainless steel, copper or aluminum, while the SMA ring (or clamp) may be any commercially available SMA clamp, such as the heat shrinkable rings offered by Intrinsic Devices, Inc. of San Francisco, Calif. In one implementation, rectangular cross-section SMA clamps may be chosen for use in an apparatus as presented herein. The height of the barbs and the heat shrink characteristics of the SMA clamp may be chosen by one skilled in the art for a particular implementation based upon the description provided herein. Note that, in another embodiment of this implementation, barbs 710 could be slightly or fully recessed within a circumferential groove in the fitting.

In view of the constrained space available within a liquid-cooled electronic system, such as a liquid-cooled electronics rack described above in connection with FIGS. 2-5, and to facilitate servicing of the liquid-cooling apparatus, it is desirable to provide for mechanical, fluid-tight connections between hoses and fittings, such as a hose barb fitting, without or absent the use of any clamp over the hose and hose barb fitting connection, in order to streamline the connections and connection process.

Figure 8A:
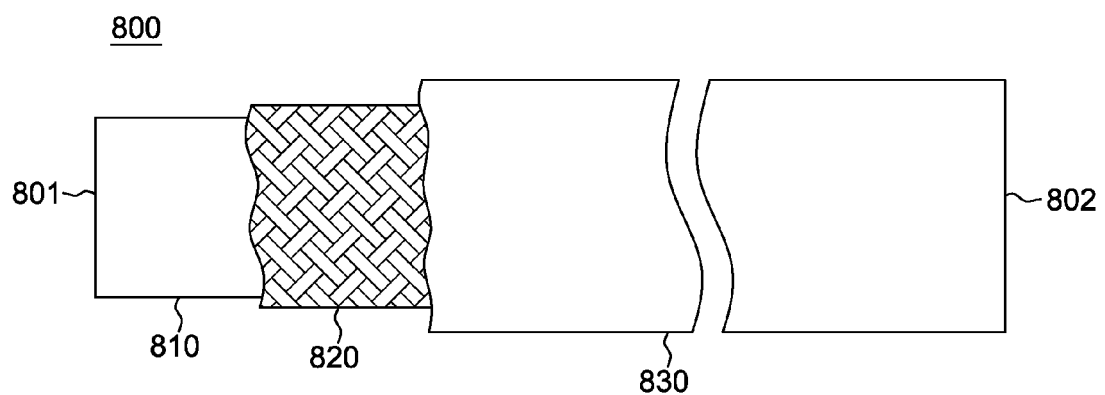
FIG. 8A is a schematic of one embodiment of a straight hose with a reinforcement layer over an innermost elastomer layer useful in a liquid-cooling apparatus such as depicted in FIGS. 2-5, in accordance with one or more aspects of the present invention.

FIG. 8A depicts one embodiment of straight hose with a braided fiber reinforcement layer. As illustrated, straight hose 800 includes an innermost elastomer layer 810, a fiber-reinforcement layer 820, and an outermost elastomer layer 830. The inner and outer elastomer layers may be fabricated of the same or different elastomeric material. In one specific example, the inner and outer elastomer layers 810, 830 may comprise a rubber material. As noted, in the example depicted, the middle fiber-reinforcement layer 820 comprises a braided fiber-reinforcement layer, which is a relatively high-density, fiber reinforcement, such as illustrated. This high-density-rated fiber reinforcement extends from a first end 801 to a second end 802 of the hose, and advantageously provides deformable hose 800 with a relatively high burst pressure point, including at the end 801 where coupled to a hose barb fitting 840, such as shown in FIG. 8B, without the use of any clamp over the deformable hose and fitting connection.

Note that as used herein, the burst pressure point, or internal burst pressure point, refers to the internal pressure of the hose necessary to, for instance, cause the hose-fitting connection to leak, or for the hose to disconnect from the fitting. The burst pressure is the internal pressure within the hose needed to, for instance, overcome any compressive force on the fitting resulting from the fiber-reinforcement layer within the hose, and the tight sliding of the hose over the fitting.

Figure 8B:
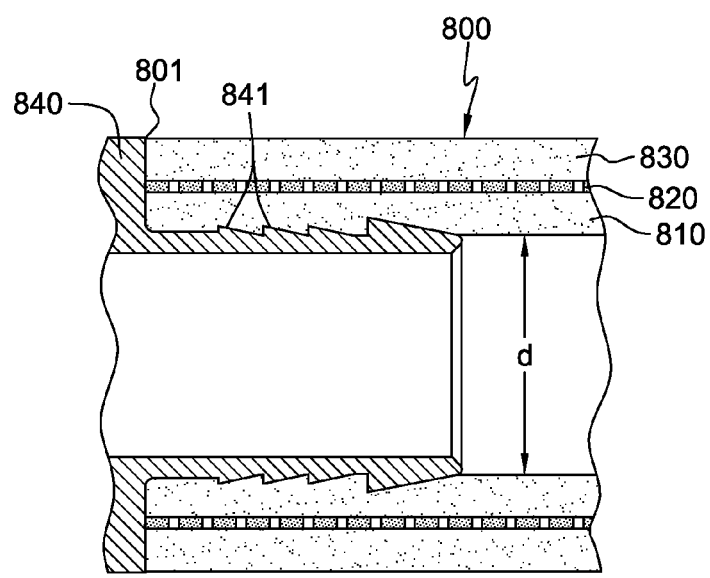
FIG. 8B depicts the straight hose of FIG. 8A, with one end thereof shown slid over a hose barb fitting, wherein the fiber-reinforcement layer facilitates providing a desired mechanical, fluid-tight connection with a relatively high internal burst pressure point, absent any clamp over the straight hose and hose barb fitting connection, in accordance with one or more aspects of the present invention.

As shown in FIG. 8B, fitting 840, which may be fabricated of a metal, such as stainless steel, copper, aluminum, etc., includes one or more raised features (or barbs) 841 on an exterior surface thereof. Fitting 840 and/or straight hose 800 are fabricated so that the outer diameter of the fitting and inner diameter 'd' of the straight hose are sized or slip (or friction fit) together, with the straight hose end deforming somewhat to accommodate barbs 841 of fitting 840. Limiting the deformation of straight hose 800 is a compressive force which is generated by the fiber-reinforcement layer 820 comprising the high-density reinforcement. As a result, the end of straight hose 800 forms a good, mechanical, fluid-tight connection with fitting 840, without the need for a clamp over the hose-fitting connection.

Another type of hose, that is, other than a straight hose, is a formed hose (or pre-formed hose). A formed hose is a permanently-shaped, partially-deformable, reinforced hose, with one or more bends or curved portions permanently formed into the hose intermediate the first and second (or opposite) ends of the formed hose. A formed hose generally will have a lower burst pressure point than a straight hose such as depicted in FIGS. 8A & 8B, since the fiber-reinforcement layer of a formed hose is necessarily less dense than that of a straight hose (having, for instance, a braided fiber-reinforcement pattern or configuration). This is because in a formed hose, it is necessary to be able to bend the hose during fabrication, in order to provide the one or more permanently-shaped bends to the formed hose. Thus, conventionally, a clamp would be required for a formed hose to make good mechanical, fluid-tight connection to a fitting, such as a hose barb fitting. Disclosed herein are numerous variations to a formed hose configuration and method of fabrication which advantageously remove the need for a clamp, while still providing a fluid-tight connection with a desired, high burst pressure point.

Conceptually, disclosed herein are formed hoses with one or more fiber-reinforcement layers, disposed between inner and outermost elastomer layers, and which include different fiber-reinforcement regions of different fiber-reinforcement densities. Advantageously, the first and second ends of the formed hose are formed with fiber-reinforcement regions of higher reinforcement density compared with one or more intermediate regions of the formed hose between the first and second ends where, for instance, one or more permanently-shaped bends of the formed hose may be located.

Generally stated, disclosed herein are apparatuses comprising an enhanced formed hose, cooled electronic systems employing such an enhanced formed hose, and methods of fabrication thereof. The apparatuses include a formed hose sized to engageably slide over a hose fitting, such as a hose barb fitting, with less deformation than a conventional formed hose, in order to provide a good mechanical, fluid-tight connection with the hose fitting, without the need for any clamp over the formed hose and hose barb fitting connection. Less deformation of the formed hose is achieved by providing one or more fiber-reinforcement layers which include a first reinforcement region of a first reinforcement density over the innermost elastomer layer located, at least in part, at the at least one bend or curved portion of the formed hose, and multiple second fiber-reinforcement regions of a second reinforcement density over, at least in part, the innermost elastomer layer at the first and second end regions of the formed hose. The second reinforcement density of the second fiber-reinforcement regions is greater than the first fiber-reinforcement density of the first fiber-reinforcement region. The second fiber-reinforcement density being greater than the first fiber-reinforcement density results in the second fiber-reinforcement regions at the first and second end regions of the formed hose being less radially-deformable than, for instance, in the middle of the hose, where the one or more permanently-shaped bends may be located. This greater fiber-reinforcement density at the ends of the hose thus facilitates a stronger connection of the formed hose to the hose barb fitting when engageably slid or friction fit over the hose fitting, absent any clamp over the formed hose and hose-fitting connection.

Numerous embodiments of a formed hose as disclosed herein are possible. For instance, in one or more implementations, the first fiber-reinforcement region may comprise a first fiber-reinforcement layer that extends between the first and second ends of the formed hose, and the second fiber-reinforcement regions may comprise a second fiber-reinforcement layer which overlies (or underlies) the first fiber-reinforcement layer, including at the first and second ends of the formed hose. By way of example, the first fiber-reinforcement layer may be formed as a relatively loose, knit fiber-reinforcement pattern, and the second fiber-reinforcement layer may be a different fiber-reinforcement pattern than the knit fiber-reinforcement pattern of the first fiber-reinforcement layer. For instance, the second fiber-reinforcement layer could comprise a spiral reinforcement pattern, or alternatively, a braided reinforcement pattern. Still further, any other reinforcement pattern could be employed for the second reinforcement layer, including a further knit reinforcement pattern, particularly a further knit reinforcement pattern with closer fiber linking so as to provide a denser fiber reinforcement within the second fiber-reinforcement regions. The denser fiber reinforcement within the second fiber-reinforcement regions advantageously results in a greater compressive force being applied to the hose barb fitting when the fitting and hose end are engageably slid together. By selecting the fiber-reinforcement pattern and/or density of the fiber-reinforcement at the first and second end regions of the formed hose, it is possible to control the amount of compressive force being generated on the hose barb fitting by the formed hose, and thereby control and provide a higher burst pressure point for the formed hose-fitting connection, without the use of any clamp.

In another implementation, the first and second fiber-reinforcement regions may be within the same fiber-reinforcement layer, with the fiber-reinforcement being differently configured for different regions of the formed hose. For instance, the first fiber-reinforcement region may comprise a knit fiber-reinforcement pattern, and the multiple second fiber-reinforcement regions may have a different fiber-reinforcement pattern than the knit fiber-reinforcement pattern of the first fiber-reinforcement region, or alternatively, a closer knit pattern. For instance, the second fiber-reinforcement regions may have a braided fiber-reinforcement pattern, or any other fiber-reinforcement pattern that provides a denser fiber-reinforcement than the knit fiber-reinforcement pattern of the first fiber-reinforcement region. As noted, the higher reinforcement density of the second fiber-reinforcement regions is specifically configured to provide, in one aspect, the formed hose with the ability to form a mechanical, fluid-tight connection, at either end, with a hose fitting, such as a hose barb fitting, with a higher burst pressure point than would be possible if the formed hose had only the first fiber-reinforcement region of the fiber-reinforcement density throughout the hose. In one or more implementations, the second fiber-reinforcement regions may also include one or more second fiber-reinforcement regions disposed intermediate the first and second ends of the formed hose, for instance, to provide greater rigidity and less deformability to the formed hose along its length.

To summarize, disclosed herein are various formed hose designs, which may be pre-formed in complicated bent or curved shapes, while still allowing for robust and reliable hose-fitting connection joints, without the use of any clamp over the connection joint. Current formed hoses typically have a low burst pressure point, and thus require the use of clamps in order to maintain a good, fluid-tight connection.

In general, hose burst pressure is, at least in part, a function of the density of the fiber-reinforcement wound around the innermost elastomer layer (or tube). The tighter the reinforcement, that is, the greater the density of the fiber-reinforcement, the stiffer the hose will be, and the higher the burst pressure point. Stiffer hoses generally require higher force to bend, and higher pressure to expand in diameter. Straight hoses that don't need to have very sharp bend radii may have 70%, or more, of the area of the inner elastomer layer surface covered by fiber reinforcement, such as the braided fiber-reinforcement discussed above in connection with FIGS. 8A & 8B. This is considered high reinforcement coverage, and it results in the straight hose design being stiff, that is, relatively unbendable and difficult to expand in diameter (i.e., difficult to deform). Such a straight hose will have a high burst pressure, making any hose-barb joint connection reliable, without the need for a clamp. A stiff hose, such as a straight hose design with higher density fiber reinforcement has a robust hose-fitting connection because the expansion of the hose when forced over the hose fitting result in a high-tensile circumferential stress in the hose, which produces a high compressive stress of the hose over the fitting, such as over a hose barb fitting. This high compressive stress makes the hose-fitting connection robust, that is, makes the connection a high burst pressure point. However, the higher fiber-reinforcement density of the straight hose makes the straight hose stiff, with limited ability to bend, and would be impractical for a formed hose configuration, where it is desired to have one or more permanently-shaped curves or bends in the hose.

As noted, formed hoses are hoses that are cured in a desired shape so the desired shape is retained at room temperature. The desired shape would include one or more bends or curved portions in the hose. A formed hose may be set in a desired shape by curing the hose on, for instance, a bent mandrel that has the desired shape. To allow the hose to be bent to the desired shape during curing, the fiber-reinforcement layer should be loose enough to allow for the uncured hose to be bent into the desired shape. Thus, in one implementation, the formed hose fiber-reinforcement layer may be a looser knit configuration or pattern, instead of a braided pattern, such as might be used in a straight hose. A knitted reinforcement pattern is looser than a braided reinforcement pattern, and allows the uncurved hose to be slid onto a forming mandrel prior to the curing process. The disadvantage of a knitted, reinforced, formed hose, is that the resultant formed hose has a lower burst pressure point than, for instance, a straight hose which comprises a braided fiber-reinforcement pattern. The formed hose diameter will expand at relatively low pressure, compromising the hose-fitting connection robustness, at least in comparison to a straight hose configured with a braided fiber-reinforcement pattern. This again assumes that no clamp or securing mechanism is to be employed over the formed hose and hose-fitting connection.

Thus, to overcome the problem of poor integrity of the formed hose-fitting connection, disclosed herein are modified formed hose configurations where, at least, the end regions of the formed hose are made with a higher density fiber-reinforcement so as to be stiffer, that is, less deformable, and provide a greater compressive stress when slid over a hose fitting, such as a hose barb fitting. This results in a higher internal burst pressure point connection than previously achievable with a formed hose, that is, without any clamp or securing mechanism over the hose and fitting at the connection point. The end regions or sections should be, in one embodiment, longer than the length of the hose fitting within the formed hose to allow for maximum compressive force to be applied at the connection between the formed hose and the hose fitting. In one example, higher fiber-reinforcement density may be achieved by tightening the knitted reinforcement pattern in the desired regions to provide higher fiber-reinforcement coverage over the inner elastomeric layer or tube. Other approaches would be to have the higher reinforcement regions to be fabricated of a braided fiber-reinforcement pattern, for instance, in place of or superimposed over, a knitted reinforcement pattern of the formed hose.

As noted, in other implementations, various formed hose configurations are possible. For instance, the higher fiber-reinforcement regions could be extended past the hose fitting length within the formed hose. Also, the formed hose could have additional regions or sections with higher fiber-reinforcement density, where bending is not required, to form the permanently-shaped, deformable, reinforced hose, and less stiff or lower fiber-reinforcement in regions where bending is required. Further, fiber-reinforcement density could be varied along the length of the formed hose with, for instance, alternating higher and lower fiber-reinforcement density regions along the length of the formed hose, as desired.

This could be readily achieved by one skilled in the art through programming of, for instance, a braiding or knitting machine used in the formed hose fabrication process, or by using multiple such machines. During fabrication, multiple formed hoses could be produced by forming a longer length hose, and selectively cutting the formed hose, for example, in a region of higher fiber-reinforcement density, so that the end sections (or regions) of the formed hoses have the desired stiffness and provide the desired compressive stress when engagably slid over a hose barb fitting to form a mechanical, fluid-tight connection therewith. This can be achieved, after the outermost elastomer layer or tubing is extruded, by first partially curing the formed hose before cutting it into the desired lengths. The cut hoses may then be bent in the desired shape and finally cured to achieve the desired hose configuration, with higher fiber-reinforcement density end regions at their ends, that will result in the desired robust hose-fitting connections, without the use of any clamp or securing means over the hose-fitting connections.

Figure 9A:
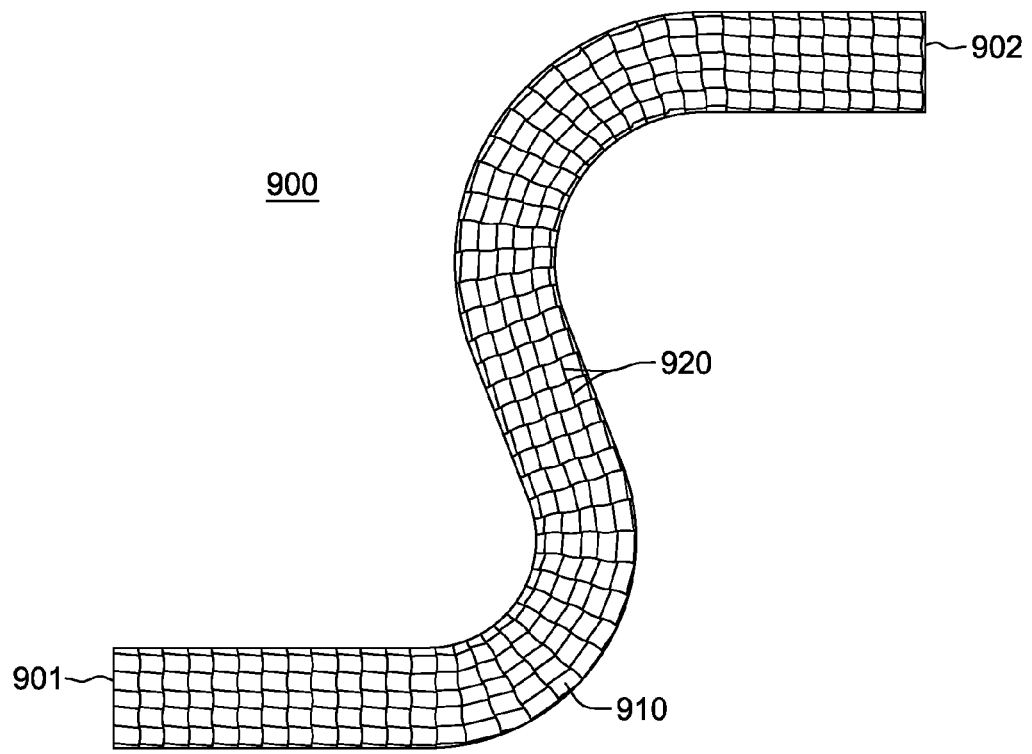
FIG. 9A depicts one embodiment of a formed hose with, for instance, a knitted reinforcement pattern over the innermost elastomer layer extending from a first end to a second end thereof.
Figure 9B:
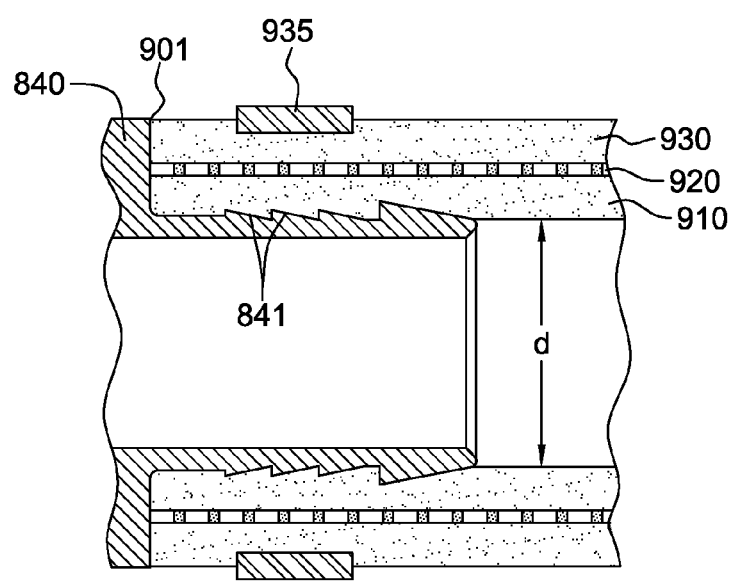
FIG. 9B depicts the formed hose of FIG. 9A, with one end thereof disposed over a hose barb fitting to form a connection therewith, and with a clamp shown disposed over the formed hose and the hose barb fitting to ensure good mechanical, fluid-tight connection between the hose and fitting.

FIGS. 9A & 9B depict one embodiment of a formed hose 900 with a looser knit fiber-reinforcement layer. As shown in FIG. 9A, formed hose 900 includes an innermost elastomer layer or tube 910 and, by way of example, a knit fiber-reinforcement layer 920 which extends along the length of formed hose 900 form a first end 901 to a second end 902. In this example, it is assumed that knit fiber-reinforcement layer 920 is a consistent layer along its length, with fiber-reinforcement covering, for instance, about 10%-30% of innermost elastomer layer 910. Note that the outermost elastomer layer 930 (FIG. 9B) is not shown in FIG. 9A, in order to better illustrate knit fiber-reinforcement layer 920. In practice, the outermost elastomer layer covers knit fiber-reinforcement layer 920 along the length of formed hose 900. The knit fiber-reinforcement layer is configured loose enough to allow the uncurved hose to be slid onto a forming mandrel (not shown) prior to the curing process. The disadvantage of such a formed hose 900 is that when applied over a hose fitting 840, such as depicted in FIG. 9B, a clamp 935 must be used in order to ensure a good hose-fitting connection at an acceptable burst pressure. Without the clamp, the formed hose diameter would expand relatively easily, that is, at a relatively low pressure point due to the lower compressive force generated by the less dense knit fiber-reinforcement layer 920.

Figure 10A:
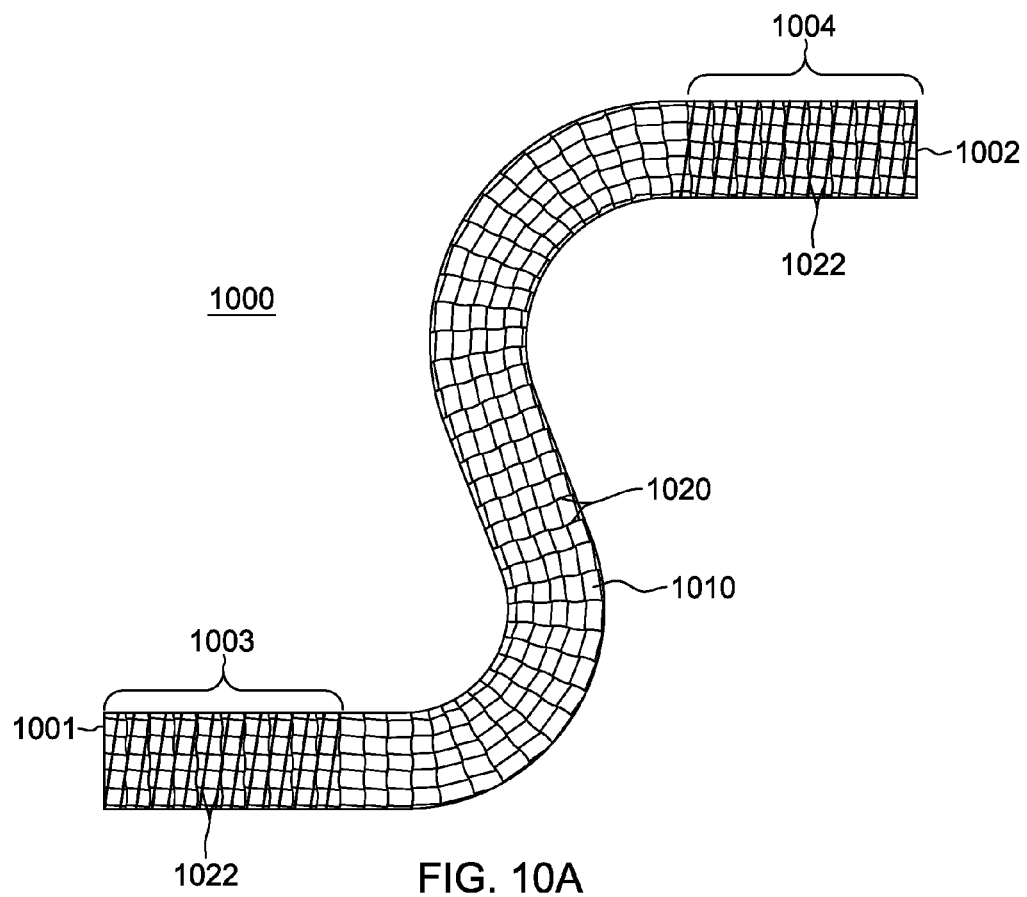
FIG. 10A depicts one embodiment of a formed hose, with multiple fiber-reinforced regions of different reinforcement density, and with greater fiber-reinforcement density shown over first and second end regions of the formed hose, in accordance with one or more aspects of the present invention.
Figure 10B:
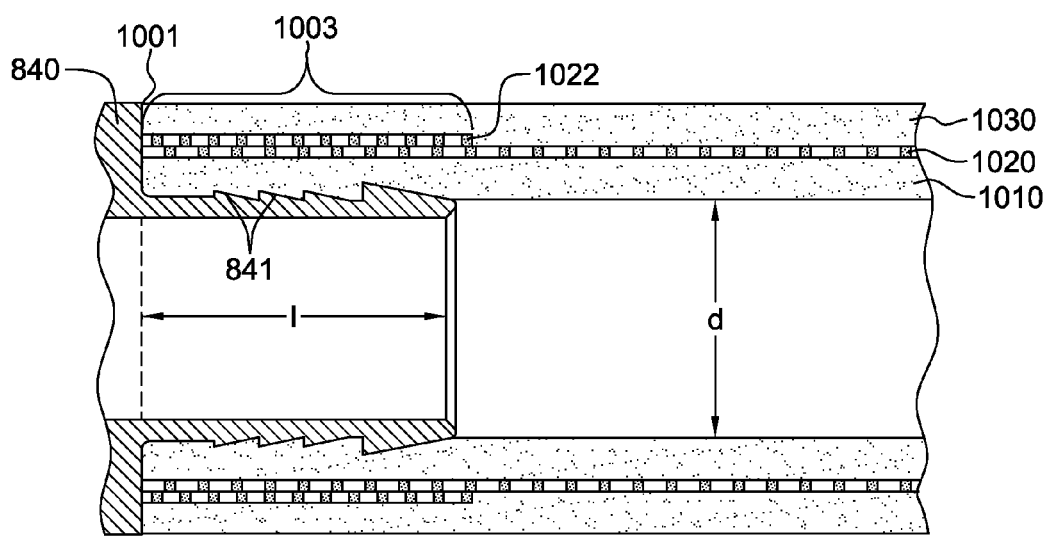
FIG. 10B depicts the formed hose of FIG. 10A, with one end thereof disposed over a hose barb fitting to form a good mechanical, fluid-tight connection therewith, absent any clamp over the formed hose and hose barb fitting connection, in accordance with one or more aspects of the present invention.

FIGS. 10A & 10B depict one embodiment of a formed hose 1000, in accordance with one or more aspects of the present invention. In the illustration of FIG. 10A, the outermost elastomer layer (1030 in FIG. 10B) is again not shown in order to better illustrate one embodiment of a fiber-reinforcement pattern, such as disclosed herein. As discussed above, and as illustrated in FIG. 10A, to overcome the problem of poor integrity of a formed hose-fitting joint or connection without the use of a clamp, proposed herein is that the formed hose be provided with regions of higher fiber-reinforcement densities 1003, 1004, that is, at the two ends 1001, 1002 of the formed hose 1000. This makes the end regions stiffer (by providing fiber-reinforcement that has a greater fiber-reinforcement density), which will advantageously increase the burst pressure necessary to fail the resultant formed hose-fitting connection, in the absence of a clamp. The end regions can be made to have higher burst pressure by using, in one embodiment, an additional spiral wrap fiber-reinforcement, with a relatively high resultant density being achieved by the combination of fiber-reinforcements, meaning there is a relatively high coverage area of fiber over the innermost elastomer layer 1010.

In the embodiment of FIG. 10A, the spiral wrap is a second reinforcement layer 1022 that lies over the knit reinforcement layer 1020 (extending the full length of the formed hose). In another embodiment, the higher fiber-reinforcement regions at the ends 1001, 1002 of the formed hose 1000 could be formed in the same reinforcement layer by selectively adjusting the density of the fiber-reinforcement and/or the pattern of the fiber-reinforcement in the desired regions during manufacture in order to provide the greater degree of stiffness in those regions, and thus, the greater degree of compressive force holding the formed hose and fitting connection together when the formed hose is engagably slid over the appropriately sized fitting. As noted, the fiber-reinforcement density and/or fiber-reinforcement pattern may be controlled or adjusted to achieve a desired amount of radial deformation, and thus compressive force, being generated in the end regions of the formed hose configured to accept the hose barb fittings. One embodiment of such a connection is depicted in FIG. 10B.

As shown in part in FIG. 10B, the higher fiber-reinforcement regions 1003, 1004 at the ends 1001, 1002 of the formed hose 1000 are sufficiently long so as to extend the length 'l' of the hose fitting 840 within the hose when the hose and fitting are slidably engaged, as illustrated. This allows for a greater total compressive force to be applied at the connection by the higher density fiber-reinforcement of the formed hose.

Figure 10C:
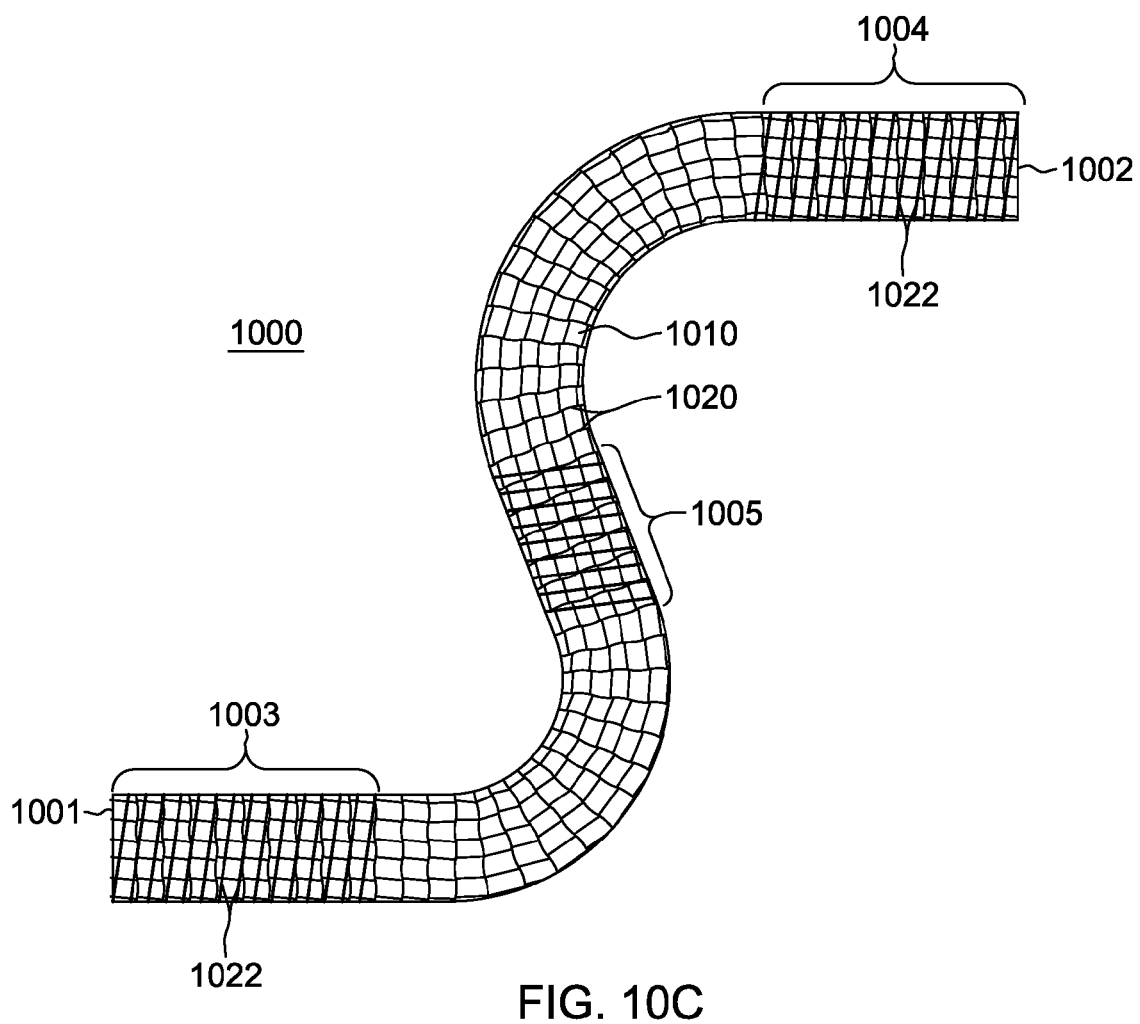
FIG. 10C depicts a variation on the formed hose embodiment of FIG. 10A, where an additional fiber-reinforced region is added intermediate the first and second end regions of the formed hose having the greater fiber-reinforced density, in accordance with one or more aspects of the present invention.

FIG. 10C depicts a variation on the formed hose of FIGS. 10A & 10B, wherein an additional fiber-reinforcement region 1005 is provided intermediate ends 1001, 1002 of formed hose 1000. As with FIG. 10A, the outermost elastomer layer is not shown in the embodiment of FIG. 10C in order to better illustrate one pattern for the different fiber-reinforcement regions of the formed hose. Note that multiple additional fiber-reinforcement regions 1005 of higher density may be provided along the length of the hose, provided that the higher density regions do not inhibit the ability to pre-form the hose with the desired one or more bends. In one embodiment, the additional fiber-reinforcement region 1005 may be formed in the same manner as the enhanced fiber-reinforcement regions 1003, 1004 at the first and second ends 1001, 1002 of formed hose 1000.

Note that in a further embodiment of the formed hose of FIGS. 10A-10C, the regions of higher density fiber-reinforcement could, alternatively, be fabricated of a similar knit pattern to the remaining portions of the formed hose, only the density of the knit pattern may be significantly increased in order to provide the greater coverage over the innermost elastomer layer or tube, and thus the desired compressive force over the hose barb fitting when the fitting is friction fit into an end of the formed hose.

FIGS. 11A-12B depict further possible variations of a formed hose, in accordance with one or more aspects of the present invention.

Figure 11A:
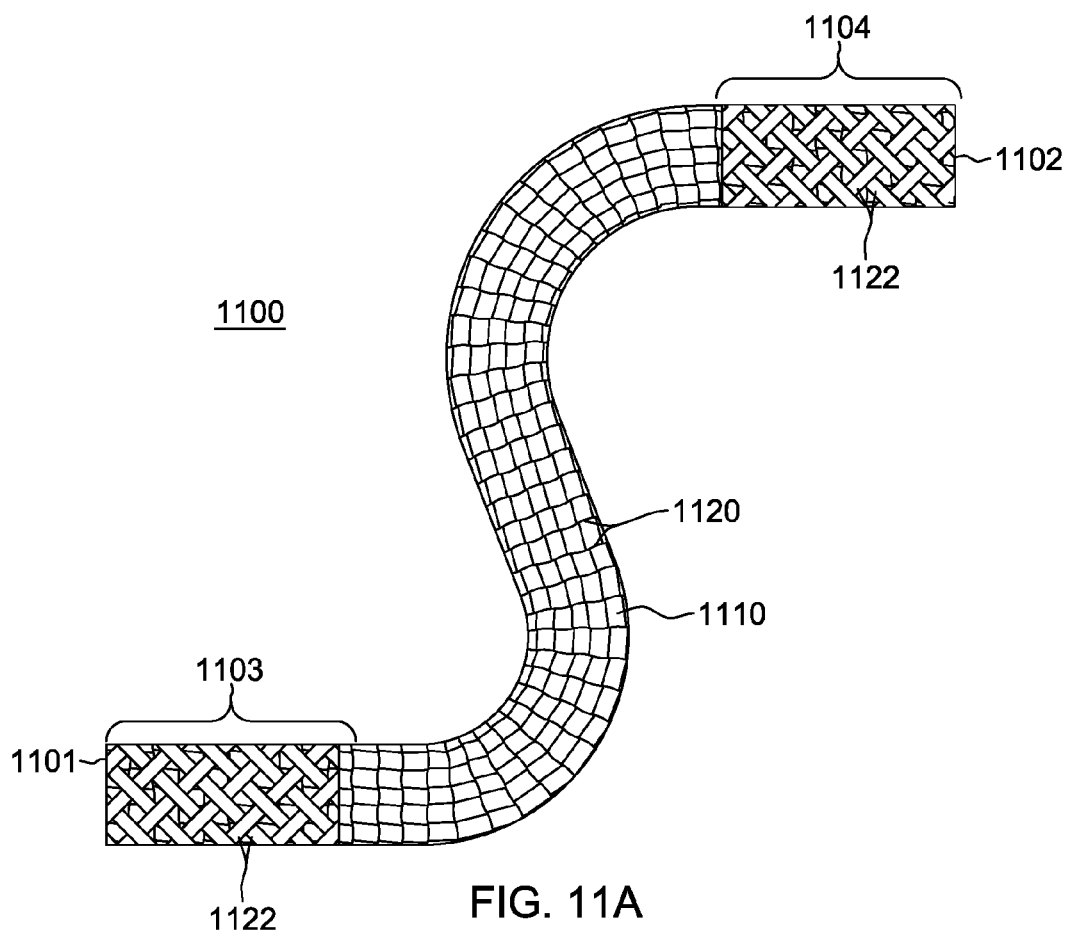
FIG. 11A depicts another embodiment of a formed hose, with multiple fiber-reinforcement regions of different reinforcement density, and with greater fiber-reinforcement density shown over first and second end regions of the formed hose, in accordance with one or more aspects of the present invention.
Figure 11B:
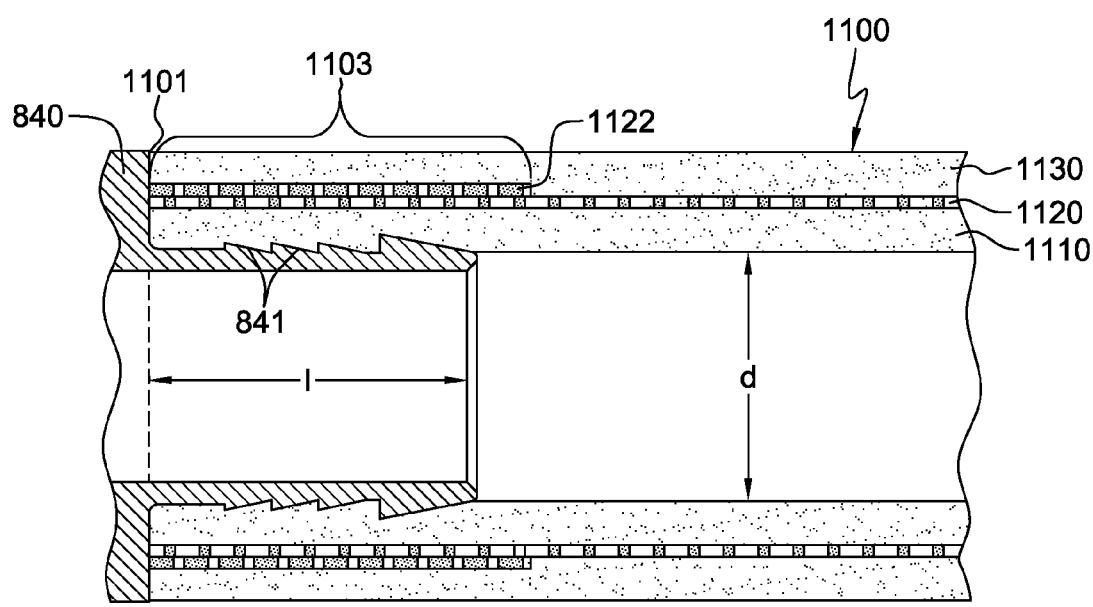
FIG. 11B depicts the formed hose of FIG. 11A, with one end thereof disposed over a hose barb fitting to form a good mechanical, fluid-tight connection therewith, without any clamp being disposed over the formed hose and hose barb fitting connection, in accordance with one or more aspects of the present invention.

Referring to FIGS. 11A & 11B, a formed hose 1100 is illustrated, which includes an innermost elastomer layer 1110, a fiber-reinforcement layer 1120, and an outermost elastomer layer 1130 (see FIG. 11B). In this embodiment, the fiber-reinforcement layer 1120 is assumed to extend from a first end 1101 to a second end 1102 of the formed hose 1100. In addition, in a first end region 1103 and a second end region 1104, a second fiber-reinforcement layer 1122 is provided, overlying the fiber-reinforcement layer 1120. In the example illustrated, fiber-reinforcement 1120 is again (by way of example only) a knit pattern fiber-reinforcement, while the second fiber-reinforcement layer 1122 is, for instance, a braided reinforcement layer, which may provide even greater coverage over the innermost elastomer layer 1110, compared with the coverage of the innermost elastomer layer of FIGS. 10A-10C, using a spiral-wound, supplemental fiber-reinforcement layer. As illustrated in part in FIG. 11B, the second fiber-reinforcement layer 1122 at the first and second end regions 1103, 1104 extends, in one embodiment, for a length greater than a length 'l' of fitting 840 extending into formed hose 1100.

Figure 12A:
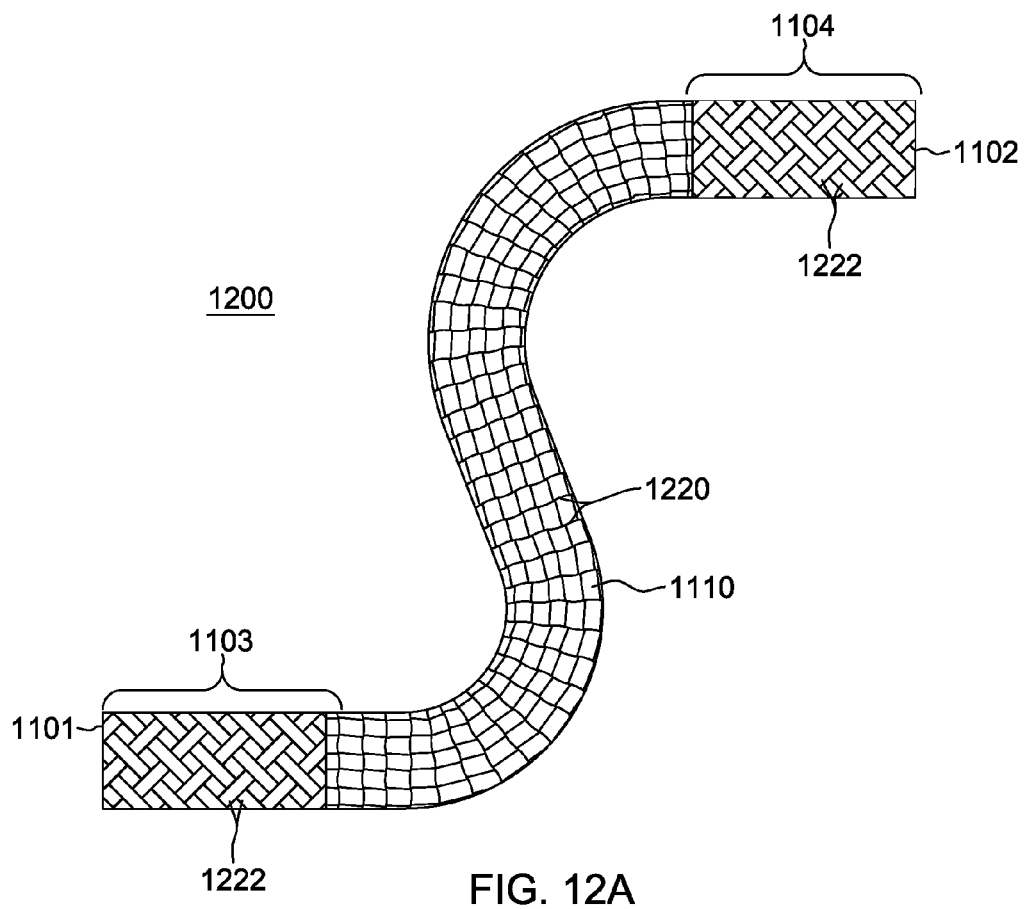
FIG. 12A depicts a further embodiment of a formed hose, with multiple fiber-reinforcement regions of different fiber-reinforcement density, and with greater fiber-reinforcement density shown over first and second end regions of the formed hose, in accordance with one or more aspects of the present invention.
Figure 12B:
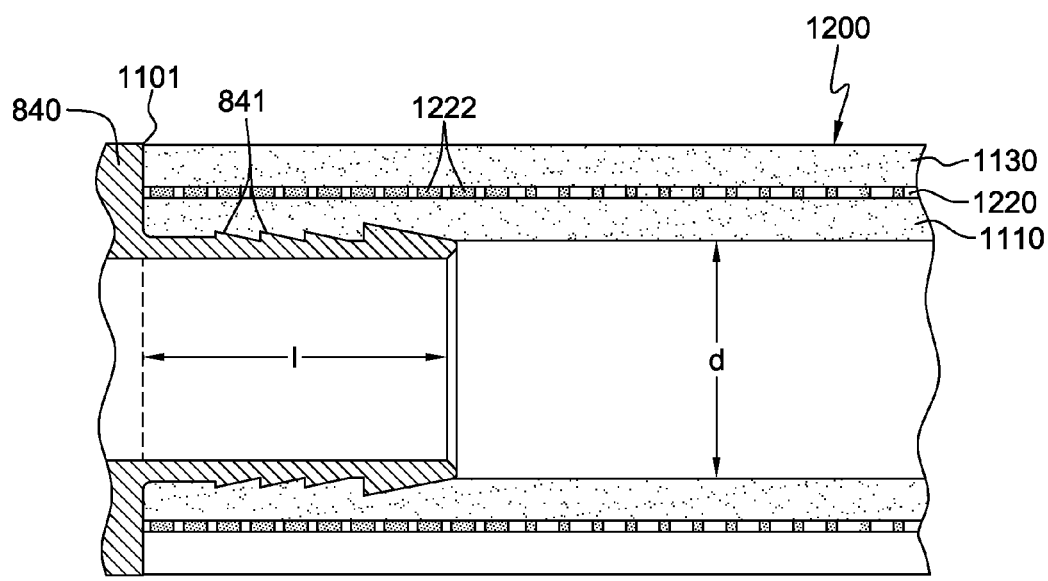
FIG. 12B depicts the formed hose of FIG. 12A, with one end thereof disposed over a hose barb fitting to form a good mechanical, fluid-tight connection therewith, without any clamp being disposed over the formed hose and hose barb fitting connection, in accordance with one or more aspects of the present invention.

By way of further example, the formed hose 1200 of FIGS. 12A & 12B is analogous to the formed hose embodiment of FIGS. 11A & 11B, with the exception that the first and second end regions 1103, 1104 of higher fiber-reinforcement density are formed in a common fiber-reinforcement layer with the remaining fiber-reinforcement layer 1120 of the formed hose 1200. This common fiber-reinforcement layer, with different regions of different fiber-reinforcement density and/or patterning can be seen in the cross-sectional elevational view of FIG. 12B, wherein first end 1101 of formed hose 1200 is shown connected to hose barb fitting 840. As illustrated, the higher density fiber-reinforcement 1222 at the first and second end regions 1103, 1104 of formed hose 1200 extends, in one embodiment, for a length of the formed hose sufficient to cover the length 'l' of hose barb fitting 840 extending into formed hose 1200 when the formed hose to hose barb fitting connection is made.

Note that in the embodiments described above, it is desirable to have a minimum portion of the innermost elastomer layer remain uncovered by the fiber-reinforcement in order to allow for good bonding of the innermost elastomer layer and outermost elastomer layer during fabrication of the formed hose. The embodiments disclosed herein thus provide a balance between generating sufficient compressive force at the ends of the formed hose when coupled to a hose barb fitting, while still allowing the first and second elastomer layers at the ends of the hose to sufficiently bond during the fabrication process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooled electronic system comprising:
an electronic system comprising at least one liquid-cooled component;
a liquid-cooling apparatus for facilitating liquid coolant flow through the at least one liquid-cooled component of the electronic system, the cooling apparatus comprising:
a coolant loop with a mechanical, fluid-tight connection comprising a hose barb fitting and a formed hose slid over the hose barb fitting at one end thereof, the formed hose facilitating carrying liquid coolant towards or away from the at least one liquid-cooled component of the electronic system, and the formed hose being a permanently-shaped, partially-deformable, reinforced hose formed with at least one bend intermediate a first end region and a second end region thereof, and comprising:
an innermost elastomer layer;
a first fiber-reinforcement region of a first fiber-reinforcement density over the innermost elastomer layer and disposed, at least at the at least one bend of the formed hose;
multiple second fiber-reinforcement regions of a second fiber-reinforcement density over, at least in part, the innermost elastomer layer, with second fiber-reinforcement regions of the multiple second fiber-reinforcement regions being disposed at least at the first and second end regions of the formed hose, wherein the second fiber-reinforcement density is greater than the first fiber-reinforcement density; and wherein the first and second end regions of the formed hose are less radially-deformable than the at least one bend thereof due, at least in part, to the second fiber-reinforcement density of the second fiber-reinforcement regions at the first and second end regions of the formed hose being greater than the first fiber-reinforcement density of the first fiber-reinforcement region at the at least one bend thereof, the second fiber-reinforcement density facilitating providing the mechanical, fluid-tight connection, absent any clamp over the formed hose and hose barb fitting connection.

2. The cooled electronic system of claim 1, wherein the first fiber-reinforcement region of the first fiber-reinforcement density of the formed hose comprises a first fiber-reinforcement layer which extends between a first end and a second end of the formed hose, and the multiple second fiber-reinforcement regions are defined in a second fiber-reinforcement layer overlaying the first fiber-reinforcement layer, including at the first and second end regions of the formed hose.

3. The cooled electronic system of claim 2, wherein the first fiber-reinforcement layer comprises a knit reinforcement pattern, and the second fiber-reinforcement layer is a different reinforcement pattern than the knit reinforcement pattern of the first fiber-reinforcement layer.

4. The cooled electronic system of claim 3, wherein the second fiber-reinforcement layer comprises one of a spiral reinforcement pattern or a braided reinforcement pattern.

5. The cooled electronic system of claim 1, wherein the first fiber-reinforcement region of the formed hose comprises a knit reinforcement pattern, and the multiple second fiber-reinforcement regions of the formed hose comprise a different reinforcement pattern than the knit reinforcement pattern of the first fiber-reinforcement region.

6. The cooled electronic system of claim 5, wherein the second fiber-reinforcement regions of the formed hose comprise one of a spiral reinforcement pattern or a braided reinforcement pattern.

7. The cooled electronic system of claim 1, wherein the second fiber-reinforcement region overlying the hose barb fitting at one of the first end region or the second end region of the formed hose extends for a length greater than a length of the hose barb fitting over which the formed hose resides.

\* \* \* \* \*